United States Patent
Swallow et al.

(10) Patent No.: US 11,019,863 B2
(45) Date of Patent: Jun. 1, 2021

(54) CONDUCTIVE TEXTILE ASSEMBLY WITH ELECTRICAL SHIELDING STRUCTURE

(71) Applicant: Intelligent Textiles Limited, Middlesex (GB)

(72) Inventors: Stanley Shigezo Swallow, Chiswick (GB); Asha Peta Thompson, Teddington Middlesex (GB)

(73) Assignee: Intelligent Textiles Limited

( * ) Notice: Subject to any disclaimer, the term of this patent is extended or adjusted under 35 U.S.C. 154(b) by 0 days.

(21) Appl. No.: 16/970,713

(22) PCT Filed: Feb. 19, 2019

(86) PCT No.: PCT/GB2019/050430
§ 371 (c)(1),
(2) Date: Aug. 18, 2020

(87) PCT Pub. No.: WO2019/158946
PCT Pub. Date: Aug. 22, 2019

(65) Prior Publication Data
US 2020/0375290 A1    Dec. 3, 2020

(30) Foreign Application Priority Data
Feb. 19, 2018   (GB) ...................... 1802651

(51) Int. Cl.
*H05K 9/00*    (2006.01)
*A41D 31/04*   (2019.01)
(Continued)

(52) U.S. Cl.
CPC .............. *A41D 31/04* (2019.02); *A41D 1/005* (2013.01); *A42B 3/04* (2013.01); *D03D 1/0058* (2013.01);
(Continued)

(58) Field of Classification Search
CPC ....................................................... H05K 9/009
See application file for complete search history.

(56) References Cited

U.S. PATENT DOCUMENTS

| 4,818,820 A | 4/1989 | Larock |
| 6,870,105 B2 * | 3/2005 | Maydanich .......... H01B 7/0861 |
| | | 174/117 F |

(Continued)

FOREIGN PATENT DOCUMENTS

| WO | WO 2015/101759 A1 | 7/2015 |
| WO | WO 2016/053624 A1 | 4/2016 |

(Continued)

OTHER PUBLICATIONS

PCT International Search Report, dated May 23, 2019, Appln. No. PCT/GB2019/050430.

*Primary Examiner* — Hung V Ngo
(74) *Attorney, Agent, or Firm* — Craig A. Fieschko, Esq.; DeWitt LLP

(57) ABSTRACT

A conductive assembly (10) includes a conductive fabric core (12) which includes at least one electrically conductive element woven with the fabric core, optionally first and second impermeable layers (14, 16) enveloping the fabric core (12), first and second spacer layers (18, 20) overlying or within the impermeable layers (14, 16) and first and second conductive shield or screen layers (22, 24) overlying the spacer layers. The shield layers are electrically coupled together in the preferred embodiment for electromagnetic shielding. The spacer layers (18, 20) provide a stable and uniform spacing between the shield or screen conductors (22, 24) and the conductive fabric core (12).

17 Claims, 14 Drawing Sheets

(51) Int. Cl.
*A41D 1/00* (2018.01)
*A42B 3/04* (2006.01)
*D03D 1/00* (2006.01)
*D03D 15/00* (2021.01)

(52) U.S. Cl.
CPC .......... *D03D 1/0088* (2013.01); *D03D 15/00* (2013.01); *H05K 9/009* (2013.01); *D10B 2401/16* (2013.01); *D10B 2501/06* (2013.01)

(56) References Cited

U.S. PATENT DOCUMENTS

| | | | |
|---|---|---|---|
| 8,816,208 B2 * | 8/2014 | Huang | H01B 11/203 |
| | | | 174/117 F |
| 8,975,521 B2 * | 3/2015 | Huang | H01B 7/083 |
| | | | 174/117 M |
| 2005/0235482 A1 | 10/2005 | Deaett et al. | |
| 2008/0160851 A1 | 7/2008 | Dunn et al. | |
| 2017/0175305 A1 | 6/2017 | Podhajny et al. | |
| 2017/0249033 A1 | 8/2017 | Thompson et al. | |
| 2018/0327939 A1 | 11/2018 | Cobanoglu et al. | |

FOREIGN PATENT DOCUMENTS

| | | |
|---|---|---|
| WO | WO 2017/080984 A1 | 5/2017 |
| WO | WO 2017/103562 A1 | 6/2017 |

\* cited by examiner

CONDUCTIVE TEXTILE ASSEMBLY WITH ELECTRICAL SHIELDING STRUCTURE

FIELD OF THE INVENTION

The present invention relates to a conductive fabric assembly incorporating a plurality of conductors woven into a fabric substrate. The assembly can be used as a replacement for wires or cable in, for example, the manufacture of wearable garments incorporating or to which can be attached a plurality of electrical and electronic devices.

BACKGROUND ART

There have been many attempts over recent years to manufacture fabrics having conductive elements therein, useful for a variety of applications including communications, running or powering peripheral devices, data transfer or collection, sensing and the like. Early devices sought to form multi-layered structures, intended to create physical separation between the plurality of conductors in the structure. These devices, however, were bulky, unreliable and prone to delamination.

In the applicant's earlier EP-1,269,406 and EP-1,723,276, fabric weave structures are disclosed which have proven to provide a reliable conductive fabric structure with inter-crossing conductive yarns which may be kept separate from one another, arranged to touch one another under pressure or be permanently connected together. There are also described electronic components formed by the conductive yarns. The structures disclosed in these applications have been found to work very reliably and to have good longevity. The applicant's International patent application no. PCT/GB2016/053693 filed on 24 Nov. 2016 discloses a fabric structure suitable for delivering more power through the fabric and for use in harsh and demanding conditions.

When used in more demanding conditions, a conventional fabric structure suffers from a variety of limitations, including degradation by the environment, performance loss, performance unreliability and so on. The conductive fabric structure can also be prone to electromagnetic interference and unreliable operation.

SUMMARY OF THE INVENTION

The present invention seeks to provide an improved conductive fabric assembly with an electrically shielded structure. The assembly includes a plurality of conductors, which are preferably woven with the fabric substrate and may be conductive yarns. The specific structure of the conductive fabric is not critical to the teachings herein and could take other forms than those shown in connection with FIGS. 1 to 3 and the applicant's earlier patent applications, the disclosures of which are incorporated herein by reference.

According to an aspect of the present invention, there is provided a conductive textile assembly including: a textile substrate having a plurality of electrical conductors therein, the substrate including first and second opposing sides; a first flexible conductive shield or screen layer disposed over the first side of the textile substrate; a second flexible conductive shield or screen layer disposed over the second side of the textile substrate; and first and second non-conductive flexible spacer layers each disposed between a respective shield or screen layer and the textile substrate; wherein the first and second spacer layers provide a substantially uniform dielectric gap between the conductors of the textile substrate and the first and second shield or screen layers over at least an operative section of the assembly.

The first and second shield or screen layers form a Faraday cage that prevents the ingress and/or egress of electromagnetic radiation to or from the conductive textile substrate. The first and second shield or screen layers may advantageously be arranged as electrical ground planes or voltage references.

In some embodiments, the first and second shield or screen layers are electrically coupled to one another. Electrically coupling the shield or screen layers can in some implementations improve screening, by having a lower resistance to ground for draining magnetic, as distinct from RE, interference. However, such coupling is not necessary and in some implementations the screening may work better without connecting the two shield or screen layers together, while in other implementations screening is improved by connecting the shields or screens to a ground drain. Coupling of the shield or screen layers together may occur only if and where the assembly is attached to the metallic screening chassis of a device or connector, for example.

The first and second shield layers may be made of the same material or form, or may be of different materials or forms. In some practical implementations, one of the screen layers may be provided by a base or substrate to which the conductive fabric is coupled. This may, for example, be a garment base layer, as cabinet structure, fuselage and so on.

Each spacer may be a layer of non-conductive material or a thickness of non-conductive fibres disposed over the electrical conductors of the textile substrate and forming a part of the weave of the substrate.

In the preferred embodiment, each spacer retains a substantially consistent spacing between their respective shield or screen layer and the textile substrate, thereby providing a substantially uniform dielectric gap between the conductors of the textile substrate and the shield or screen layers over at least an operative section of the assembly. Most preferably, each spacer retains a consistent and uniform spacing between its respective shield or screen layer and the textile substrate. It is preferred that the spacing is the same for both spacer layers.

The assembly provides a flexible structure for an article incorporating a conductive fabric, in which each shield or screen is held spaced from the conductors, in practice by a predetermined distance so as to minimise electromagnetic interference, achieve a uniform characteristic impedance for the conductors, and control or reduce capacitively coupled losses from the conductors to the shields or screens, thereby optimising the conductors for signal transmission. The assembly also enables the conductors to be held to a reliable ground or voltage reference if required, provided by the shield or screen layers.

In a preferred embodiment, the shield or screen layers and the spacer layers are bonded to one another so as to ensure a consistent spacing between the shield or screen layers and the textile substrate during use.

Advantageously, the textile substrate is a woven fabric and the plurality of electrical conductors are part of the weave. The electrical conductors may be conductive yarns. Such a structure can provide a robust array of conductors for an article and one which is flexible and suitable as an item of apparel, for example.

Preferably, the electrical conductors are disposed generally side-by-side with a substantially uniform spacing to each shield or screen layer. For this purpose, the electrical conductors may be disposed in co-planar relationship, particularly in a single plane over at least a part of an area of the fabric substrate, although they may be disposed in a plurality of planes over at least a part of an area of the fabric substrate. A consistent spacing of the conductors from the shields or screens ensures that the electrical effects of the shield or screen layers are consistent across and along the conductors.

In a practical embodiment, the electrical conductors weave into and out of the fabric substrate.

The non-conductive spacer layer is preferably laterally compressible and substantially incompressible into the plane thereof. Lateral compressibility confers flexibility to the spacer layer, useful for a conformable fabric, used for example in clothing, while the in-plane incompressibility ensures that a consistent spacing between the shield or screen layers and the conductive fabric is maintained even as the assembly is folded or bent.

In a preferred embodiment, the non-conductive spacer layer is formed of an open mesh of non-conductive filaments. The non-conductive filaments are advantageously arranged in an array of tessellating polygons, such as a honeycomb array. This has been found to provide a structure with robust reliability and which has good flexibility.

In a practical embodiment, the non-conductive spacer layer is formed from one or more layers of open mesh of non-conductive filaments.

Advantageously, the non-conductive spacer layer is formed from two or more layers of open mesh of non-conductive filaments, the layers optionally being attached to one another at their edges only. In other words, the two or more layers are able to slide over one another at least at their central zones, which contributes to the flexibility and conformability of the assembly.

Each spacer layer may typically have a thickness of 0.5 to 1.0 millimetres, according to the characteristic impedance sought, but the thickness of the spacer layers is dependent upon a variety of factors including the dimensions, spacing, resistance, inductance and capacitance of the conductors, as well as the dielectric constant of the spacer material. Therefore, in practice spacer thickness is determined by a combination of calculation or simulation and/or experiment.

In another practical embodiment, the spacer layers are composed of non-conductive yarns disposed in both warp and weft directions of the fabric substrate, and so woven as to form textile layers above and below the conductors in manners known in the art as double cloth and triple cloth. This embodiment provides for the spacer layers to be woven integrally with, and as part of the process of weaving, the fabric substrate. The attendant advantages of this embodiment are reducing component count and simplifying production.

In some practical embodiments, the assembly includes at least one layer of water or vapour impermeable material. The at least one layer of impermeable material covers at least one side of the fabric substrate, preferably both sides of the fabric. The or each layer of impermeable material is advantageously disposed directly adjacent to the fabric substrate and may be bonded to the fabric substrate by a layer of adhesive or other bonding agent, such as polyurethane, polyethylene, silane or an epoxy. In other embodiments, the or each layer of impermeable material may be disposed over the spacer(s) as well as over the fabric substrate, thereby to ensure a consistent dielectric constant of the assembly even in damp conditions.

The or each layer of impermeable material may be made of a polyamide, polyester, polyethylene, polypropylene, polyurethane, flexible polyvinyl chloride, silicone, polytetrafluoroethylene or other suitable material.

The impermeable material may be permeable to gas or air and is preferably vapour impermeable.

In preferred embodiments, the assembly includes two layers of flexible conductive shield or screen, each disposed over a respective side of the textile substrate. The two layers of flexible conductive shield or screen may be electrically connected but typically will be electrically separate.

The or each flexible conductive shield or screen may be formed of a material having a conductive coating applied thereto, such as of silver. The material may be woven, non-woven or a sheet material. Suitable materials are available, for example, from Statex GmbH.

According to another aspect of the present invention, there is provided an article including a conductive textile assembly as taught herein. The article may be a wearable item of apparel, such as a jacket, coat, vest, trousers or a cape. In other embodiments, the article may be a helmet or gloves. In yet another embodiment, the article may be a flat, ribbon-like cable, in which embodiment the article may be disposed with further layers of flexible outer covering.

Other features and advantages of the teachings herein will become apparent from the specific description which follows.

BRIEF DESCRIPTION OF THE DRAWINGS

Embodiments of the present invention are described below, by way of example only, with reference to the accompanying drawings, in which.

DESCRIPTION OF THE PREFERRED EMBODIMENTS

Figure 1:
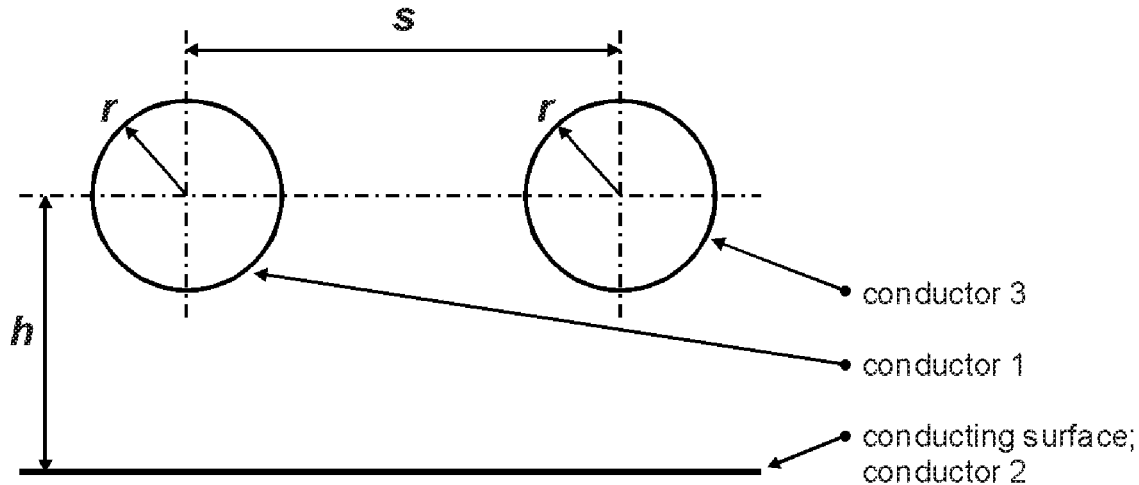
FIG. 1 is a schematic diagram depicting two conductors over a ground or voltage plane.

The preferred embodiments described below relate to a conductive fabric which includes a plurality of electrical conductors, preferably conductive yarns, which can be used for electrical and electronic circuits, for example for delivering power, transferring signals such as data or other information, for sensing, for heating, for the construction of electrical circuits or circuit components and so on. The fabric can be formed into a variety of articles including, as examples only: a flat, ribbon-like cable; a planar, flexible cable harness, comprising the equivalent of many individual wires and cables in a multiplicity of desired lengths and geometries; a wearable item of clothing such as a vest or jacket to which can be attached a variety of electrical and electronic devices. These could include, for instance, a camera, a light, a radio or telephone, a battery supply and also a control unit for controlling peripheral components attached to the article. The conductive elements woven into the fabric can be arranged to deliver power, signals and so on between the peripheral components and the control unit, as required. The fabric is of a nature that it can be bent, folded, compressed while reliably retaining the arrangement of conductors and ensuring that any crossing conductors do not undesirably come into contact with one another to cause short circuiting.

The terms shield or screen used herein are synonymous. In what follows, the term shield is used and it is to be understood that the element to which it refers may equally be described as a screen.

As is described below, the woven fabric is also able to create permanent electrical connections between crossing conductors within the woven fabric and can also include one or more circuit components as described, for example, in the applicant's earlier patents EP-1,269,406 and EP-1,723,276 and pending International patent application PCT/GB2016/053693. The specific embodiment described below depicts a data and/or power bus with a series of conductors arranged in parallel and electrically separated from one another.

The term "yarn" used herein is intended to have its conventional meaning in the art and may be of a single filament but more typically of a plurality of filaments or strands. The yarns are typically formed in sets or bundles, for example of five to seven yarns per bundle, although the number of yarns per bundle can vary as desired.

The conductors may also be of multi-filamentary form, which improves flexibility and durability of the woven fabric. In one preferred embodiment, each conductor includes a plurality of support cores, which may be made of a conductive or non-conductive material, polyester being a suitable material, although other materials such as nylon, PTFE and aramid may be used. A, or a plurality of conductive wires, such as of copper, brass, silver, gold, stainless steel, carbon or the like, is wound helically around and along each support core. The cores provide structural strength to the conductive threads. In another preferred embodiment, each conductor is composed of a plurality of filaments, which may be made of nylon, polyester or the like, which are coated, plated or suffused with a layer of conductive material such as silver, gold, tin or carbon. The nature of the conductors used in the woven fabric is not essential to the teachings herein and other structures could be used for the conductors.

The conductive fabric disclosed herein and in the applicant's above-mentioned patents and patent applications has a robust structure able to provide reliable conductive couplings in a great many applications and also over long periods of usage. There are some uses where electromagnetic interference and/or floating electrical potentials can risk adverse performance of the fabric, examples being some policing and military field uses and other highly sensitive applications. The teachings below disclose a structure for providing a robust and effective electromagnetic shield structure for a conductive fabric. It is to be understood that the teachings could be used with conductive elements which are not of fabric form, for example conductive sheets, although a conductive fabric is preferred for the pliability, reliability and longevity of the structure. The electromagnetic shield structure may be used for providing a ground plane or voltage reference for the conductors within the substrate and may also be used to attain a characteristic impedance for the assembly.

Before describing a number of working examples of the structure taught herein, it is believed an explanation of the underlying theory would be advantageous.

A frequently occurring problem in the analysis of interference coupling is that of two conductors routed over a ground plane or voltage reference, or that between the signal-mode loop and the common-mode loop. If it is assumed that the ground plane or voltage reference can be represented by a low-value resistance, then the mathematics involved in creating a coupling model becomes exceptionally complex. The inventors have devised a simpler way.

FIG. 1 illustrates an example configuration under review. The starting point for the analysis can be found in any textbook on electromagnetic theory. On a non-conducting plane surface midway between two charged conductors, the electric field is orthogonal to that surface. If this surface were to be replaced by a conducting plane, the electric field would still be orthogonal to the plane. The electric field distribution would not change.

Conversely, the flat conducting surface of FIG. 1 can be represented by non-conducting surface midway between the two conductors and a second pair of identical conductors. This is illustrated by FIG. 2.

Figure 3:
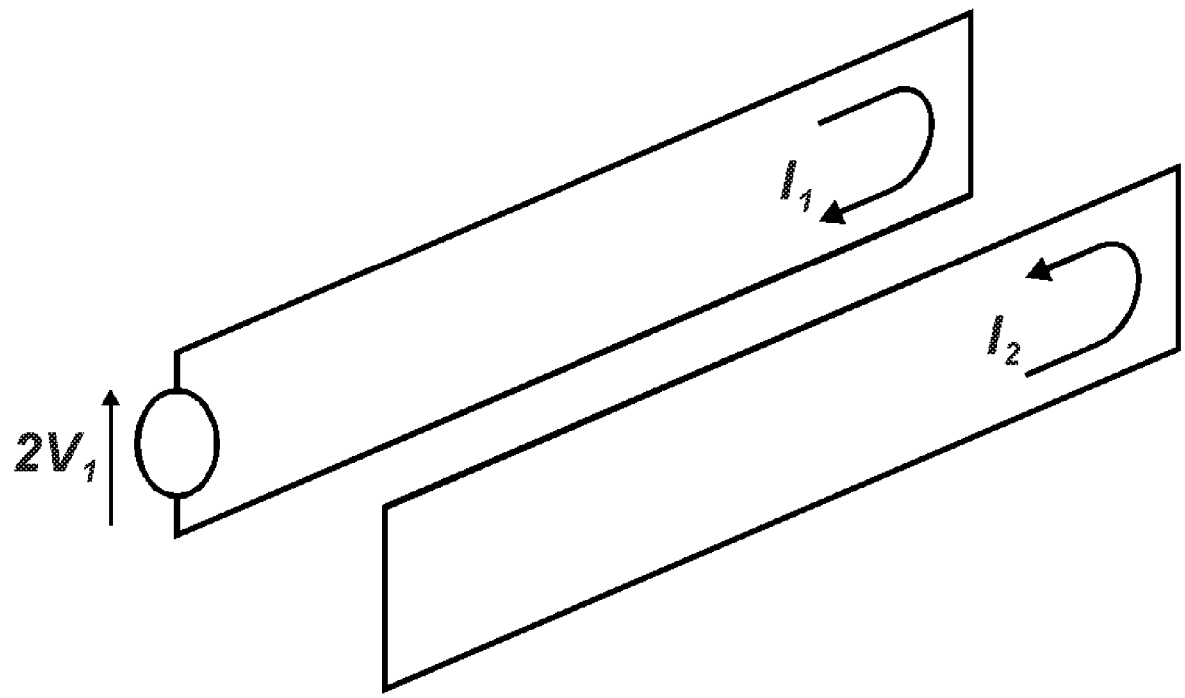
FIG. 3 is a schematic diagram depicting transformer coupling between the two conductors of FIG. 1 over the ground or voltage plane.

If these four conductors are connected as two separate loops, then the picture changes to that shown in FIG. 3. Here, the coupling is between two isolated loops. As far as magnetic field coupling is concerned, this is essentially a transformer; a transformer where the primary and secondary have one turn each and there is no magnetic material.

Figure 4:
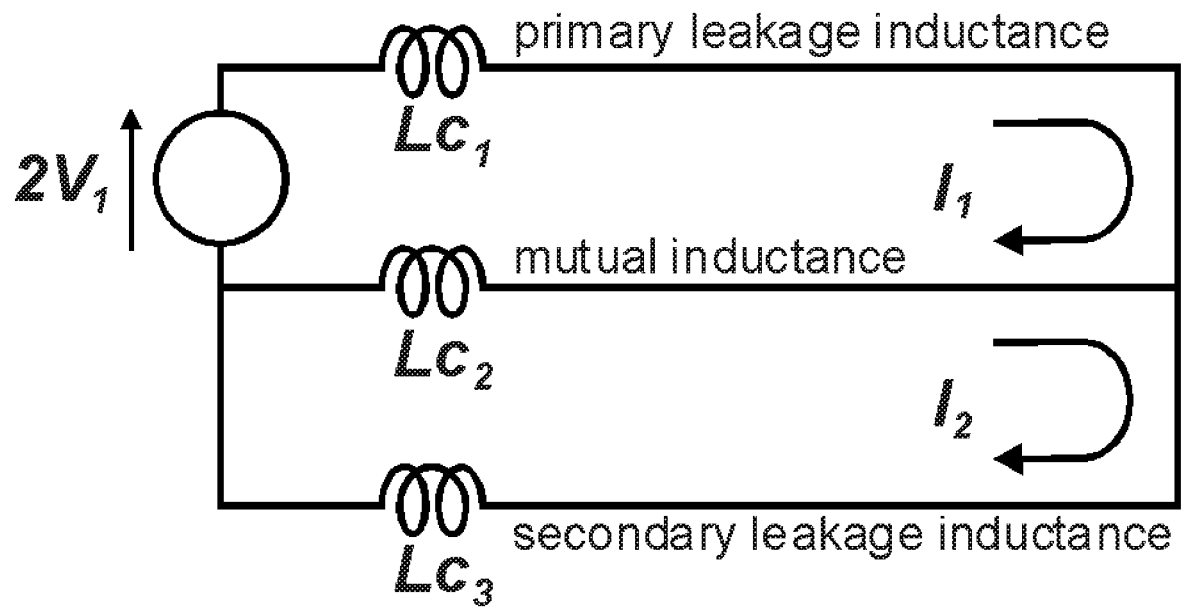
FIG. 4 shows a circuit model of the transformer coupling of FIG. 3.

The circuit model for this configuration is the familiar transformer model of FIG. 4. In this model, $Lc_1$ represents the leakage inductance of the primary, $Lc_2$ represents the mutual inductance, and $Lc_3$ represents leakage inductance of the secondary.

Figure 2:
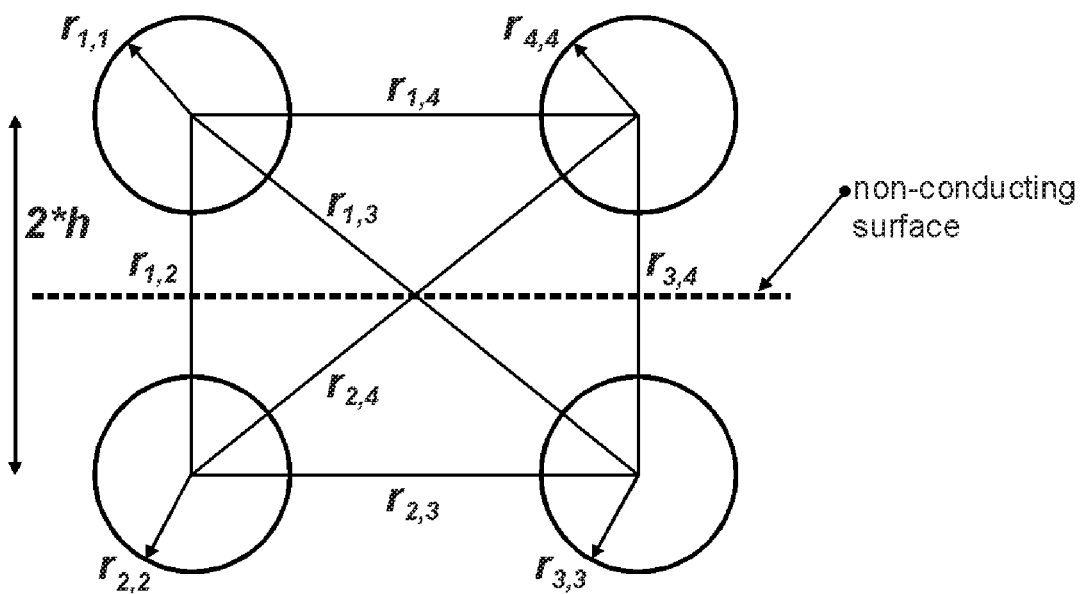
FIG. 2 is a schematic diagram depicting a simulation of the relationship of the two conductors of FIG. 1 over the ground or voltage plane.

Derivation of the component values for the transformer model starts with an analysis of the magnetic coupling between the four conductors of FIG. 2. The voltage on each conductor is a function of the current it carries as well as the currents in the other three conductors. A set of primitive equations can be formulated:

$$Vp_1 = Zp_{1,1} \cdot Ip_1 + Zp_{1,2} \cdot Ip_2 + Zp_{1,3} \cdot Ip_3 + Zp_{1,4} \cdot Ip_4$$

$$Vp_2 = Zp_{2,1} \cdot Ip_1 + Zp_{2,2} \cdot Ip_2 + Zp_{2,3} \cdot Ip_3 + Zp_{2,4} \cdot Ip_4$$

$$Vp_3 = Zp_{3,1} \cdot Ip_1 + Zp_{3,2} \cdot Ip_2 + Zp_{3,3} \cdot Ip_3 + Zp_{3,4} \cdot Ip_4$$

$$Vp_4 = Zp_{4,1} \cdot Ip_1 + Zp_{4,2} \cdot Ip_2 + Zp_{4,3} \cdot Ip_3 + Zp_{4,4} \cdot Ip_4 \quad (1)$$

Relating primitive currents to loop currents of FIG. 3:

$$Ip_1 = Il_1$$

$$Ip_2 = -Il_1$$

$$Ip_3 = Il_3$$

$$Ip_4 = -Il_2 \quad (2)$$

Substituting for primitive currents in (1):

$$Vp_1 = (Zp_{1,1} - Zp_{1,2}) \cdot Il_1 + (Zp_{1,3} - Zp_{1,4}) \cdot Il_2$$

$$Vp_2 = (Zp_{2,1} - Zp_{2,2}) \cdot Il_1 + (Zp_{2,3} - Zp_{2,4}) \cdot Il_2$$

$$Vp_3 = (Zp_{3,1} - Zp_{3,2}) \cdot Il_1 + (Zp_{3,3} - Zp_{3,4}) \cdot Il_2$$

$$Vp_4 = (Zp_{4,1} - Zp_{4,2}) \cdot Il_1 + (Zp_{4,3} - Zp_{4,4}) \cdot Il_2 \quad (3)$$

Relating loop voltages to primitive voltages:

$$2 \cdot Vl_1 = Vp_1 - Vp_2$$

$$2 \cdot Vl_2 = Vp_3 - Vp_4 \quad (3)$$

Relating loop voltages to loop currents:

$$2 \cdot Vl_1 = (Zp_{1,1} - Zp_{1,2}) \cdot Il_1 + (ZP_{1,3} - ZP_{1,4}) \cdot Il_2 - (ZP_{2,1} - ZP_{2,2}) \cdot Il_1 - (Zp_{2,3} - ZP_{2,4}) \cdot Il_2$$

$$2 \cdot Vl_2 = (Zp_{3,1} - Zp_{3,2}) \cdot Il_1 + (ZP_{3,3} - ZP_{3,4}) \cdot Il_2 - (ZP_{4,1} - ZP_{4,2}) \cdot (Zp_{4,3} - Zp_{4,4}) \cdot Il_2$$

The loop equations become:

$$2 \cdot Vl_1 = (Zp_{1,1} - Zp_{1,2} - Zp_{2,1} + Zp_{2,2}) \cdot Il_1 + (Zp_{1,3} - Zp_{1,4} - Zp_{2,3} + Zp_{2,4}) \cdot Il_2$$

$$2 \cdot Vl_2 = (Zp_{3,1} - Zp_{3,2} - Zp_{4,1} + Zp_{4,2}) \cdot Il_1 + (Zp_{3,3} - Zp_{3,4} - Zp_{4,3} + Zp_{4,4}) \cdot Il_2$$

which can be written as:

$$2 \cdot Vl_1 = Zl_{1,1} \cdot Il_1 + Zl_{1,2} \cdot Il_2$$

$$2 \cdot Vl_2 = Zl_{2,1} \cdot Il_1 + Zl_{2,2} \cdot Il_2 \quad (4)$$

where $$Zl_{1,1} = Zp_{1,1} - Zp_{1,2} - Zp_{2,1} + Zp_{2,2}$$

$$Zl_{1,2} = Zp_{1,3} - Zp_{1,4} - Zp_{2,3} + Zp_{2,4}$$

$$Zl_{2,1} = Zp_{3,1} - Zp_{3,2} - Zp_{4,1} + Zp_{4,2}$$

$$Zl_{2,2} = Zp_{3,3} - Zp_{3,4} - Zp_{4,3} + p_{4,4} \quad (5)$$

A mesh analysis of FIG. 4 gives the circuit equations:

$$2 \cdot Vc_1 = (Zc_1 + Zc_2) \cdot Ic_1 - Zc_2 \cdot Ic_2$$

$$2 \cdot Vc_2 = -Zc_2 \cdot Ic_1 + (Zc_2 + Zc_3) \cdot Ic_2 \quad (6)$$

Correlating the circuit impedances with the loop of impedances:

$$Zc_1 + Zc_2 = Zl_{1,1}$$

$$-Zc_2 = Zl_{1,2} = Zl_{2,1}$$

$$Zc_2 + Zc_3 = Zl_{2,2}$$

hence:

$$Zc_1 = Zp_{1,1} - Zp_{1,2} - Zp_{2,1} + Zp_{2,2} + Zp_{1,3} - Zp_{1,4} - Zp_{2,3} + Zp_{2,4}$$

$$Zc_2 = Zp_{1,4} - Zp_{1,3} - Zp_{2,4} + Zp_{2,3}$$

$$Zc_3 = Zp_{3,1} - Zp_{3,2} - Zp_{4,1} + Zp_{4,2} + Zp_{3,3} - Zp_{3,4} - Zp_{4,3} - Zp_{4,4} \quad (7)$$

Inductance values can be correlated with impedance values, since:

$$Zc_k = j \cdot \omega \cdot Lc_k$$

$$Zp_{i,j} = j \cdot \omega \cdot Lp_{i,j} \quad (8)$$

Invoking the relationship between cable geometry and inductance as set out for example in Circuit Modeling for Electromagnetic Compatibility, Ian B. Dorney 213 (ISBN-978-1-61353-020-7):

$$Lp_{i,j} = \frac{\mu_0 \cdot \mu_r \cdot l}{2 \cdot \pi} \ln\left(\frac{l}{r_{i,j}}\right) \quad (9)$$

where 'l' is the length of the assembly. Using equation (8) and (9) to substitute for the primitive impedances of equation (7):

$$Lc_1 = \frac{\mu_0 \cdot \mu_r \cdot l}{2 \cdot \pi} \cdot \ln\left(\frac{r_{1,2} \cdot r_{2,1} \cdot r_{1,4} \cdot r_{2,3}}{r_{1,1} \cdot r_{2,2} \cdot r_{1,3} \cdot r_{2,4}}\right) \quad (10)$$

$$Lc_1 = \frac{\mu_0 \cdot \mu_r \cdot l}{2 \cdot \pi} \cdot \ln\left(\frac{r_{1,3} \cdot r_{2,4}}{r_{1,4} \cdot r_{2,3}}\right)$$

$$Lc_1 = \frac{\mu_0 \cdot \mu_r \cdot l}{2 \cdot \pi} \cdot \ln\left(\frac{r_{3,2} \cdot r_{4,1} \cdot r_{3,4} \cdot r_{4,3}}{r_{3,1} \cdot r_{4,2} \cdot r_{3,3} \cdot r_{4,4}}\right)$$

The next step is to use the transformer coupling model to derive a model which simulates the coupling between the conductors of FIG. 1. The relationships between the radial parameters of FIG. 2 and the dimensions of FIG. 1 are:

$$r_{1,2} = r_{2,1} = r_{3,4} = r_{4,3} = 2 \cdot h$$

$$r_{1,3} = r_{3,1} = r_{2,4} = r_{4,2} = \sqrt{s^2 + 4 \cdot h^2}$$

$$r_{1,4} = r_{4,1} = r_{2,3} = r_{3,2} = s$$

$$r_{1,1} = r_{2,2} = r_{3,3} = r_{4,4} = r \quad (11)$$

The voltage source is defined as $2 \cdot V_1$ in FIG. 3 because the voltage between any conductor and its image is twice that which would exist between conductor and ground plane. Since the formulae of equation (10) have been derived for a voltage source of $2 \cdot V_1$, the inductor values are twice that associated with conductors over a plane.

Dividing each of the inductive parameters of equation (10) by 2 and invoking the relationships of equation (11) leads to:

$$Ld_1 = \frac{Lc_1}{2} = \frac{\mu_0 \cdot \mu_r \cdot l}{2 \cdot \pi} \cdot \ln\frac{2 \cdot h \cdot s}{r \cdot \sqrt{s^2 + 4 \cdot h^2}} \quad (12)$$

$$Ld_2 = \frac{Lc_2}{2} = \frac{\mu_0 \cdot \mu_r \cdot l}{2 \cdot \pi} \cdot \ln\frac{\sqrt{s^2 + 4 \cdot h^2}}{s}$$

$$Ld_3 = \frac{Lc_3}{2} = \frac{\mu_0 \cdot \mu_r \cdot l}{2 \cdot \pi} \cdot \ln\frac{2 \cdot h \cdot s}{r \cdot \sqrt{s^2 + 4 \cdot h^2}}$$

Duality between inductance and capacitance can be used to calculate values for the associated capacitors:

$$Cd_k = \frac{\mu_0 \cdot \mu_r \cdot \varepsilon_0 \cdot \varepsilon_r \cdot l^2}{Ld_k} \quad (13)$$

where the subscript 'k' identifies the conductor.

Figure 5:
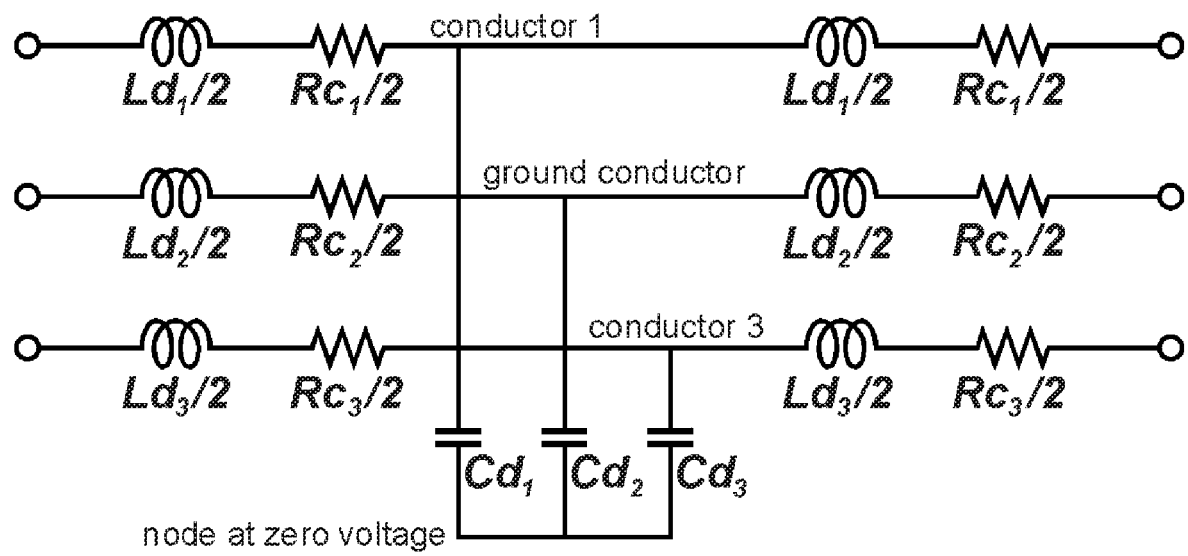
FIG. 5 shows a circuit model of two conductors over a ground or voltage plane as per the arrangement of FIG. 1.

If the spatial dimensions of the set-up are known, then a one-to-one correlation can be established between the conductors of FIG. 1 and the components of the triple-T circuit model of FIG. 5. Inductance $Ld_1$ and capacitance $Cd_1$ can be assigned to conductor 1, while inductance $Ld_3$ and capacitance $Cd_3$ can be assigned to conductor 3.

The most significant feature of equation (12) is that a value can be assigned to $Ld_2$. This is the inductance of the ground plane. Similarly, the capacitance of the ground plane is $Cd_2$.

A circuit model has been described above which can simulate both the magnetic coupling and the electric field coupling between two conductors above a ground plane. That is, it can simulate the electromagnetic field coupling. This model can be used to analyse the coupling between traces on a printed circuit board or between two conductors routed along the structure. It can also be used to simulate the coupling between the signal-mode loop and the common-mode loop of a two-conductor cable routed along the ground.

The skilled person will appreciate that the above methodology can apply similarly to a reference voltage plane.

The embodiments of shield or screen structure disclosed below can make use of the above methodology to form a structure with optimal electromagnetic shielding or screening and in some cases, if desired, improved ground plane coupling.

Figure 6:
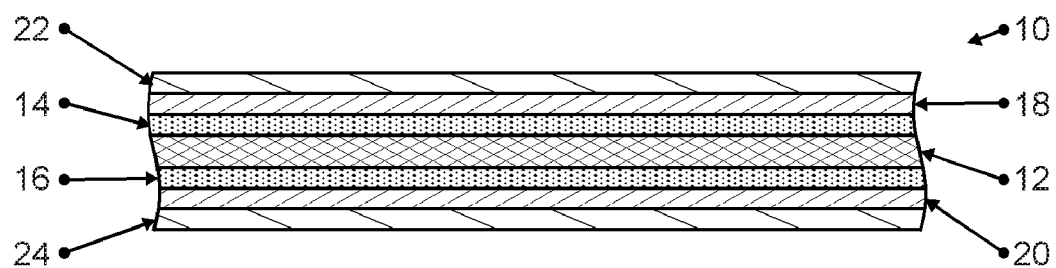
FIG. 6 is a schematic diagram showing a cross-sectional view of an embodiment of conductive fabric assembly according to the teachings herein.

FIG. 6 shows in schematic form a side elevational view of a preferred embodiment of layered conductive fabric and electromagnetic shield assembly 10 for use in the manufacture of textile articles, in particular items of apparel for use in policing, emergency services, military and similar applications. It is to be understood that the assembly may provide a ground or voltage reference, as desired.

Referring to the Figure, the embodiment of layered structure 10 shown includes a core, or substrate, 12 which is a fabric including one or more conductive elements preferably woven into the structure of the fabric. The core 12 may be formed as any of the fabrics disclosed in the applicant's earlier patents and patent applications referred to above, the disclosures of which are incorporated herein by reference.

In practical terms, it is preferred that the core 12 is a single layer of woven fabric comprising a series of non-conductive yarns and at least one conductive element woven with the non-conductive yarns. The non-conductive parts of the fabric assist in the separation of the plurality of conductive elements from one another. In the specific example there is shown and described an example of electrical signal and/or power bus woven into the fabric core. In practice, the conductive element or elements are in the form of yarns of the weave, be it warp or weft or a mixture of the two in order to have crossing conductive elements.

In the preferred embodiments, the conductive elements are made of conductive yarns.

The core 12 is preferably in the form of a pliable and conformable fabric, therefore suitable to being made into a variety of articles such as apparel. As many examples of structure of conductive fabric are described in the applicant's earlier patents and patent applications, they are not described again in detail herein.

The fabric core 12 in the example of FIG. 6 is planar with what could be described as having top and bottom opposing sides. Overlying respective sides of the core 12 are optional first and second layers 14, 16 of impermeable material. The layers 14, 16 are preferably water impermeable and may be gas and even vapour permeable, although in some cases at least they are impermeable also to water vapour. The skilled person will appreciate that the layers 14, 16 of impermeable material can be designed to have a desired non-permeability by selection of the material used, weave density, material treatment and so on. These are factors within the common knowledge of the skilled person. In one example, the layers 14, 16 of impermeable material are made of a polyamide, such as Nylon, coated or bonded with a polyurethane layer.

While FIG. 6 shows two layers 14, 16 of impermeable material, each on a respective side of the fabric core 12, in other embodiments there may be provided only a single impermeable layer on one side of the core 12, while in other embodiments the impermeable layers 14, 16 may be omitted completely. As explained above, the impermeable layer or layers 14,16 may also in some embodiments be disposed so as to overlie their respective spacer, thereby to insulate the spacer or spacers from humidity and/or moisture ingress.

Overlying each impermeable layer 14, 16 is a spacer layer 18, 20 having a structure described in further detail below. Each spacer layer 18, 20 is preferably of a uniform thickness so as to provide a uniform spacing function. The spacer layers 18, 20 are made of a non-conducting material, described below in further detail.

Overlying each spacer layer 18, 20 is a conductive shield 22, 24. The nature and structure of each conductive shield is described in further detail below.

The assembly 10 shown in FIG. 6 may have any desired shape in plan view and also need not be planar. It could, for example, be curved, as one would expect it to be when used in an article of clothing, the lining of a helmet, a security vest, and so on. It could also, for example, be folded in multiple locations, such as might be required to fit into and provide electrical interconnections within a vehicle fuselage, engine bay, equipment cabinet and so on.

Figure 7:
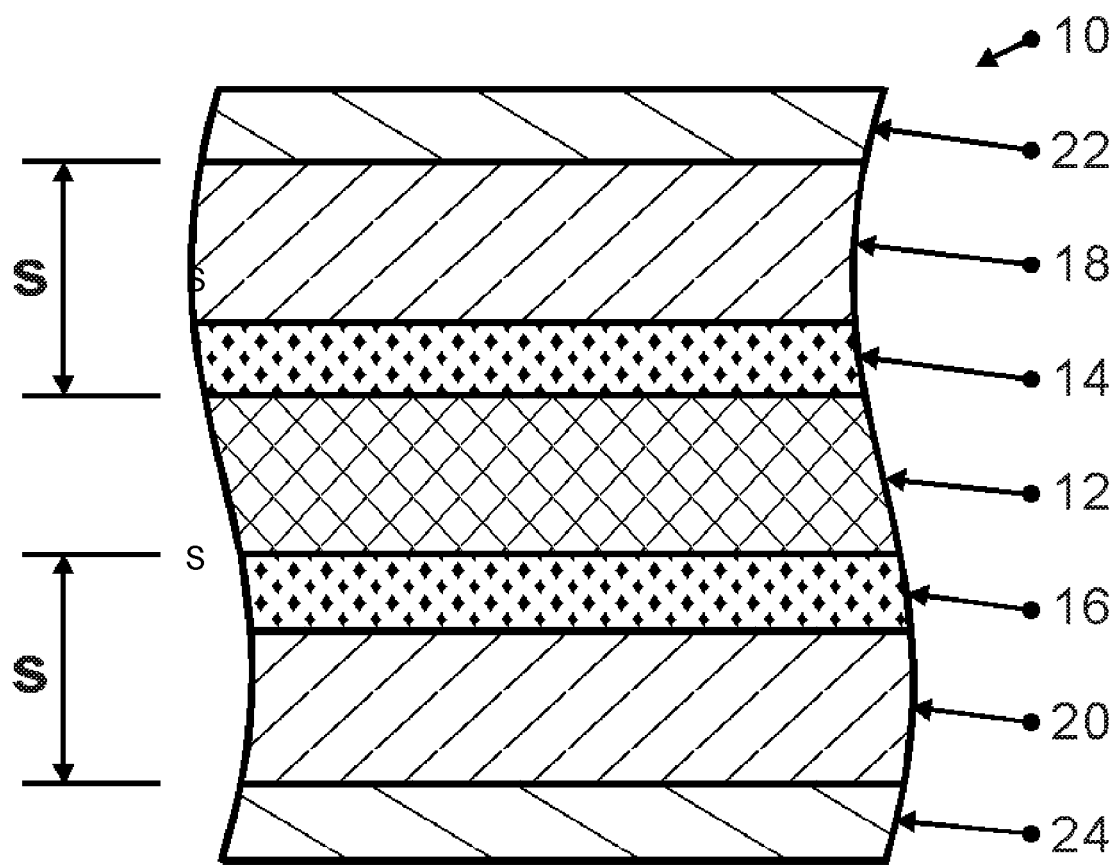
FIG. 7 is an exploded view of a part of the assembly shown in FIG. 1.

Referring now to FIG. 7, this shows an enlarged view of the assembly 10 of FIG. 6. This Figure shows the same arrangement of layers as the example of FIG. 6 for ease of reference. Also shown in FIG. 7 is the spacing S between the associated surface of the fabric core 12 and the inner surface of the associated conductive shield layer 22, 14. This spacing S is preferably, though not necessarily, the same on both sides of the core 12 and also uniform, that is substantially the same, throughout the extent of the spacer layers 18, 20. A uniform spacing provides the same dielectric gap between the core 12 and the shields 22, 24 and therefore a uniform and consistent shielding (screening) effect across the extent of the fabric core. The optimum spacing can be determined by the mathematical calculations set out above, and/or by the use of electrical simulation software, and/or by experiment. In one example, this may be in the region of 0.5 to 1.0 millimetres, for instance when a characteristic impedance of 90 ohms is desired.

A specific example of structure 10 is now described in connection with FIGS. 8 to 14.

Figure 8:
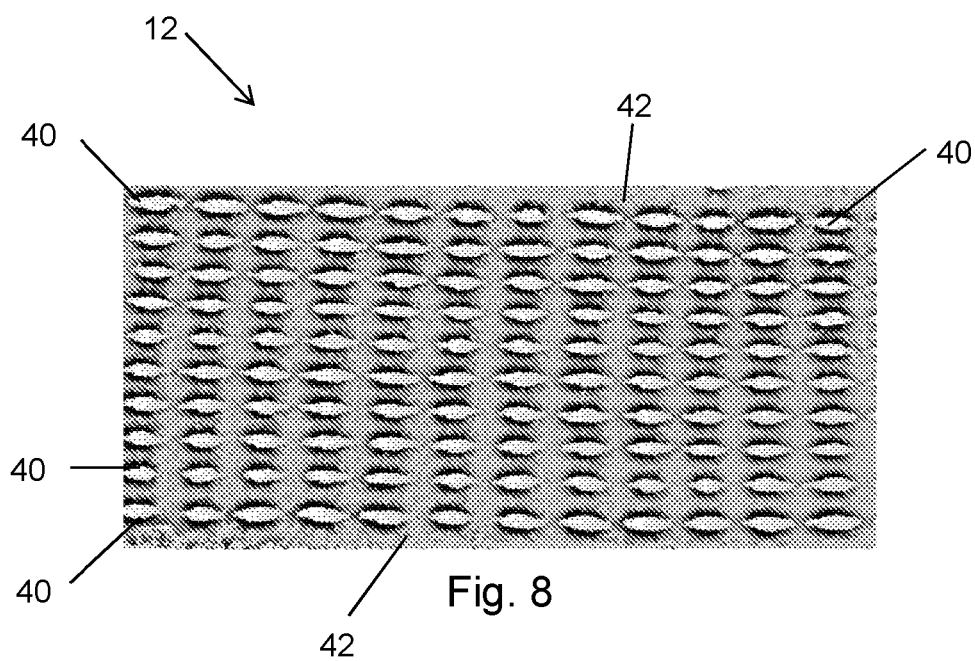
FIG. 8 is a schematic view of an example of conductive fabric.

Referring first to FIG. 8, this is a plan view showing an example of a portion of fabric core 12. The core 12 includes a series of conductive elements 40 extending in parallel along the length of the core and spaced from one another so as to be electrically insulated from one another. The conductive elements could be said to be in the form of an electrical bus, usable for signals (data or information for example) or power or a combination of the two as desired. The core also includes a series of non-conductive warp and weft fibres 42 which form a non-conductive bulk of the core 12.

The non-conductive fibres 42 may be of natural material, such as cotton, wool and the like, but are preferably made of a synthetic material such as polyester, nylon, viscose or the like, or any combination of synthetic and natural materials.

The conductors 40 of the preferred embodiments are preferably also of multi-filamentary form, which improves flexibility and durability of the woven fabric. In one preferred embodiment, each conductor 40 includes a support core, which may be made of a conductive or non-conductive material, polyester being a suitable material, although other materials such as nylon, PTFE and aramid may be used. A plurality of conductive wires, such as of copper, brass, silver, gold, stainless steel, carbon or the like, are wound helically around and along the support core. The support core provides structural strength to the conductive threads. In another preferred embodiment, each conductor is composed of a plurality of filaments, which may be made of nylon, polyester or the like, which are coated, plated or suffused with a layer of conductive material such as silver, gold, tin or carbon. The nature of the conductors used in the woven fabric is not essential to the teachings herein and other structures could be used for the conductors.

The conductors 40, as well as the other yarns forming the fabric, are all woven into a single or common layer of fabric. In other words, the fabric core 12 does not require two different woven structures, such as of the type known in the art as double cloth or woven and non-woven layers interposed over one another. The conductors 40 are incorporated into the structure of the fabric 12 during the one weaving process.

It is not excluded that in some embodiments the conductive fibres may be disposed in a plurality of overlying planes in at least a part of the core 12, for instance in cases where it is desired to have a plurality of separate conductive paths or buses. The skilled person will appreciate that reference to a single plane in practice encompasses the fact that the conductors 40 weave into and out of the fabric core 10 as a part of a single layer fabric structure.

It is not necessary for the conductors 40 to have the arrangement shown in FIG. 8, which is an example only. In fact, in a typical assembly, the conductors 40 may be disposed in both warp and weft directions and may cross one another at a plurality of crossing points and be arranged either to be physically separated by a gap or volume of non-conductive fibres or to be in temporary or permanent contact so as to provide an electrical path between crossing conductors. Examples of suitable weave structures having these arrangements are disclosed in the applicant's earlier patents and patent applications referred to above.

The conductors 40 of the fabric core 12 will typically be of low/negligible resistivity for signal transfer and power supply purposes. Other embodiments may use one or more resistive conductive elements, for instance for heating purposes.

Figure 9:
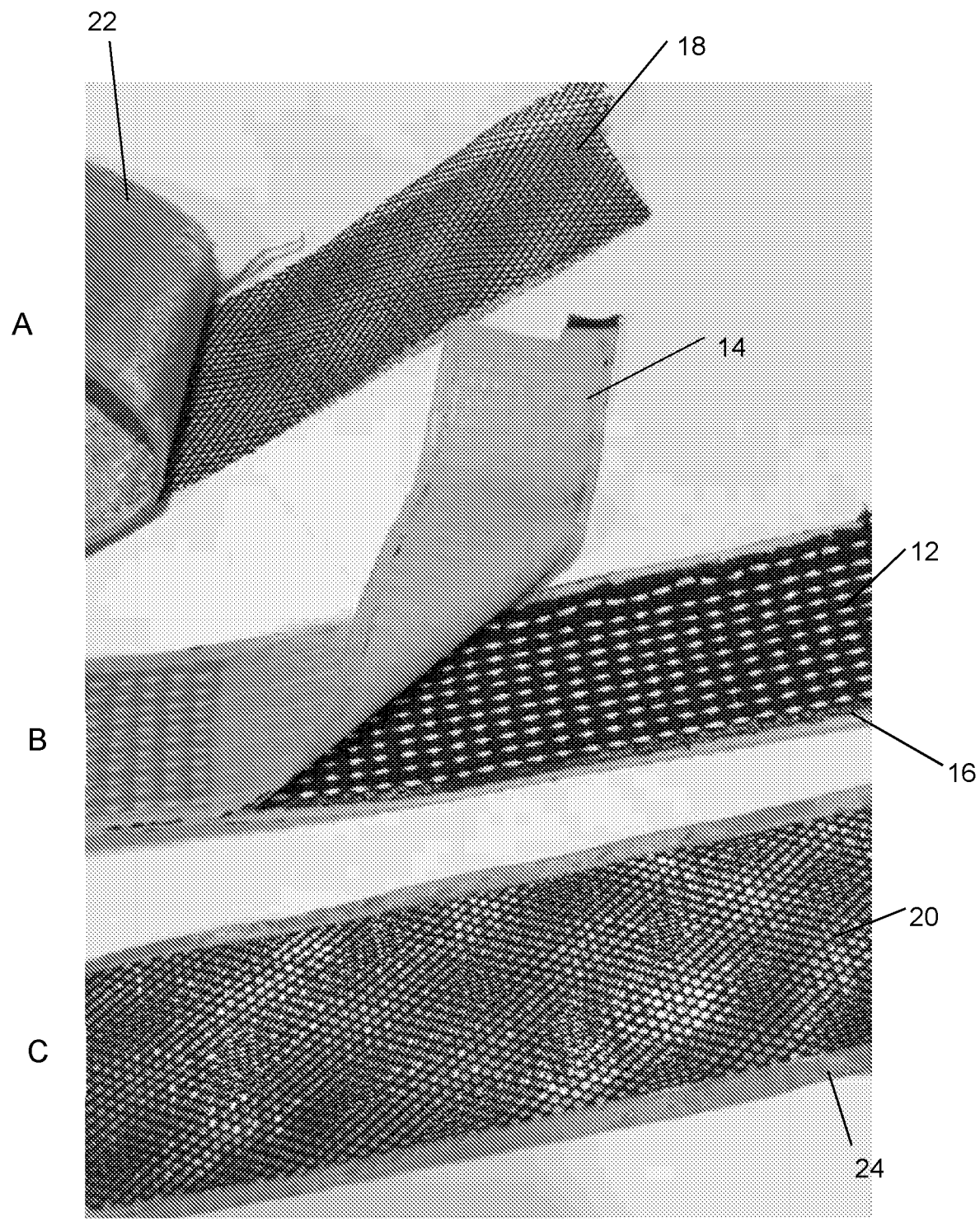
FIG. 9 is a photograph of the components of the assembly of FIG. 1 according to one embodiment.

Referring now to FIG. 9, this shows an exploded view of the preferred embodiment of conductive textile assembly according to the teachings herein.

Starting from the core of the assembly 10, shown at part B of FIG. 9, the conductive fabric core 12 is sandwiched between two layers of impermeable material 14, 16. Overlying each respective impermeable layer 14, 16 is a spacer layer 18, 20 made, in this example, of what could be described as a wire mesh and discussed in further detail below. Overlying the spacer layers 18, 20 are conductive shields 22, 24, also described in further detail below.

In the preferred embodiment, at least the layers of impermeable material 14, 16 are bonded to the conductive fabric core 12 so as to form a unitary structure. This bonding may be by any suitable adhesive, such as by a layer of polyurethane, polyethylene, silane or an epoxy. Any other adhesive or bonding agent may be used and these will be readily apparent to a person skilled in the art. The layers of impermeable material 14, 16 are preferably disposed directly adjacent the fabric core 12. In other embodiments, the layers of impermeable material 14, 1 may be disposed so as to overlie the spacer layers, thereby to prevent liquid ingress that may affect the dielectric property of the mesh.

In an embodiment, the impermeable layers 14, 16 may be of a polyamide, such as Nylon. The layers 14, 16 may be impermeable to liquids and gases, although in some embodiments may be air permeable. The skilled person will appreciate that the relative permeability of the layers 14, 16 can be adjusted by modifying the weave spacing or pick of the fabric forming the impermeable layer, the fabric thickness, fabric treatment, use of an impermeable coating or membrane, and choice of material. The skilled person will be able to determine readily a permeability which will prevent passage of liquid or vapour through the layer, thereby to keep the conductive fabric core 12 isolated from the outside environment. Impermeability is intended to prevent shorting between the conductive elements 40 of the fabric core 12 in moist or wet environments.

The impermeable layers 14, 16 are advantageously made of a non-conductive material. It is not excluded though that in some embodiments the impermeable layers may be made of a conductive material, in which case there is interposed between them and the inner fabric core 12 a non-conductive layer or element, which may be the adhesive layer. It is preferred that the impermeable layers 14, 16 are non-conductive per se.

In another embodiment, the impermeable layers 14, 16 may take the form of a membrane or sheet or coating applied to another of the layers. For instance, the impermeable layers may be applied to the interior surfaces of the shield layer, or to the exterior of the fabric core. In cases of the impermeable layers being a coating, this coating may be, for instance, polyurethane or flexible polyvinyl chloride, applied by a process of spraying, lick coating or bath, for example.

Figure 10:
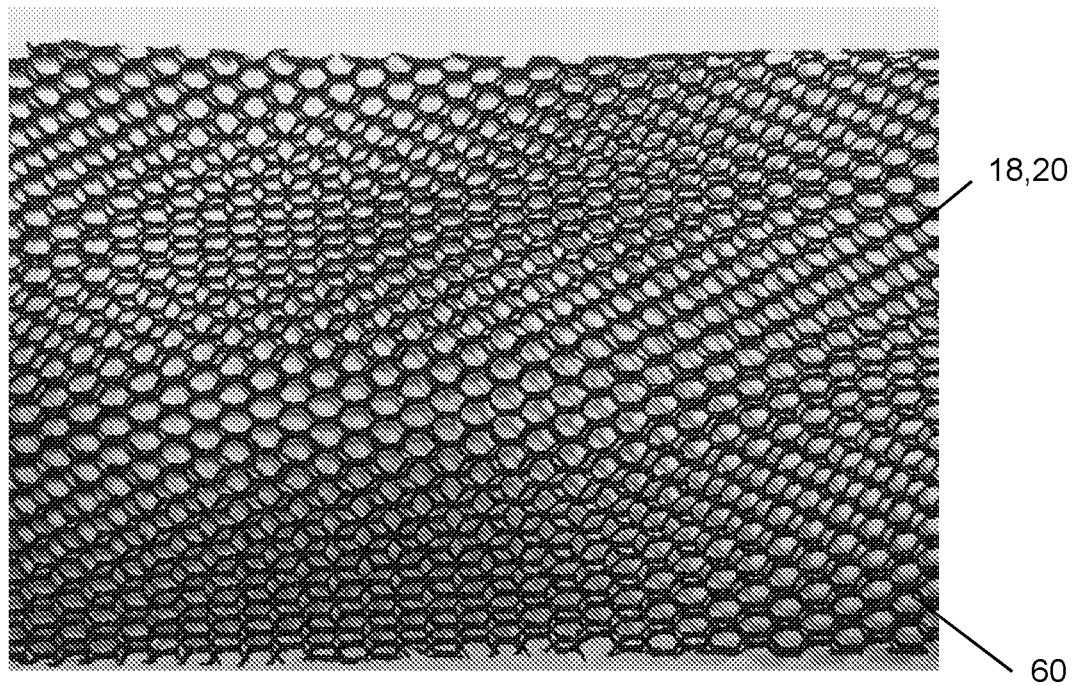
FIG. 10 is a close up view of a preferred embodiment of spacer layer of the assembly of FIG. 9.
Figure 11:
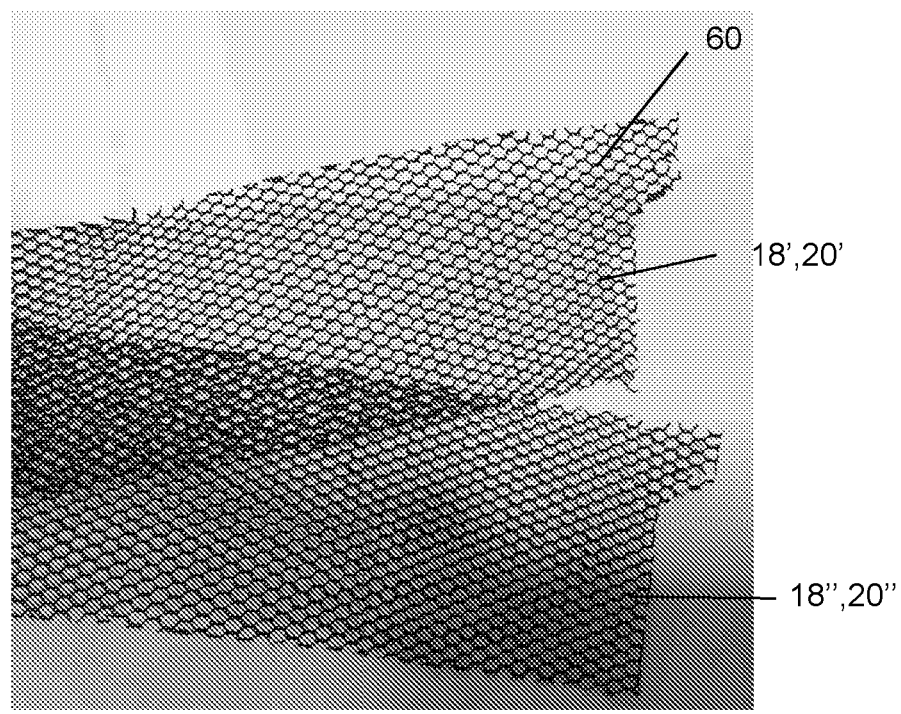
FIG. 11 shows the spacer layer of FIG. 10 with its two sublayers separated.
Figure 12:
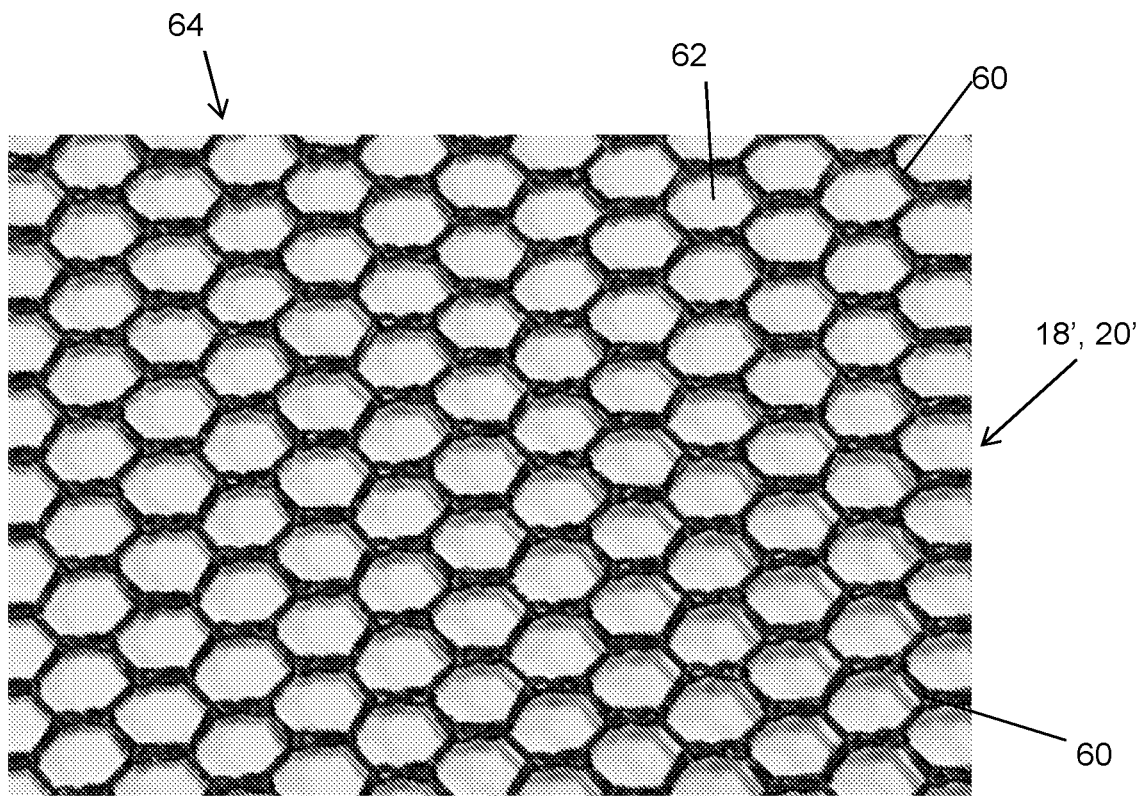
FIG. 12 is an enlarged view of a preferred embodiment of mesh structure for the spacer layer of the assembly of FIG. 10.

The spacer layers 18, 20 are shown in further detail in FIGS. 10, 11 and 12. In the preferred embodiments each spacer layer 18, 20 is made of a plurality of sub-layers 18', 18''; 20', 20''. The spacer layers 18, 20 may be made of more than two sub-layers, although it has been found that optimal performance can be achieved with just two sub-layers. Of course, it is not excluded that the spacer layers may be of a single layer material. The advantage of using a plurality of sub-layers is that these can slide over one another, increasing the flexibility of the assembly 10 whilst providing a reliable and consistent spacing between the shield layers 22, 24 and the conductive core 12. When a plurality of sub-layers is provided, these are preferably bonded to one another at their edges to retain the integrity of the structure, particularly as this is folded and bent during use.

The spacer layers 18, 20 are preferably made of a structure that is laterally compressible but substantially incompressible when pressed into the plane of the layer. In the embodiments shown, this is achieved by making the spacer layer of non-conductive wires or filaments 60 that are formed into an open mesh arrangement as is shown clearly in FIGS. 10 to 12. In particular, in the embodiments shown, the non-conductive filaments 60 are arranged in an array of tessellating polygons, preferably hexagons, 62 which could be described as a honeycomb array. The wires or filaments 60 in the honeycomb array 64 may be formed by bonding wires or filaments together while positioned in a suitable mold or die or, as shown in FIGS. 10 to 12 and in particular in FIG. 12, by wrapping the wires or filaments 60 together at the zones at which they contact. Even when wound, for instance, in two or three turns, they then may be subsequently bonded together by an adhesive, heat bonding, pressure bonding or any other method.

When so formed, the layer can only be compressed into the plane of the layer only by compressing the material of the wires per se. This gives the layers 18, 20 a very high resistance to compressibility into the plane of the layer. On the other hand, in a direction lateral to the plane of the layers 18, 20, the open structure enables the wires to flex with relative ease, thereby providing substantially greater lateral compressibility, contributing to the flexibility of the structure. As the wires will move into the spaces formed by the tessellating shape 62, any such lateral compression will not contribute to a change in the thickness of the layers 18, 20, thereby retaining the uniform spacing.

Utilising an open mesh arrangement for the spacer layers 18, 20 confers the further advantage that the dielectric constant for the spacer layers approaches the dielectric constant of air, and that the open mesh arrangement adds relatively little material, and therefore weight, to the assembly.

In other embodiments, the spacer layers may be solid sheets or membranes. For example, rubber sheets would provide flexibility and offer an advantageously higher dielectric constant, although at the expense of reduced flexibility and weight for a given thickness. Other suitable materials for the spacer layers might include polyamide, polyimide, polyester, polyethylene, polypropylene, polyurethane, flexible polyvinyl chloride, silicone, polytetrafluoroethylene or other suitable materials. It is an advantage of some of these embodiments that the spacer layers 18,20 might also confer the properties of the impermeable layers 14, 16 to the assembly, thus rendering the impermeable layers 14, 16 unnecessary and reducing component count and/or weight and/or cost of manufacture. However, in practice, an assembly of distinct spacer layers 18, 20 and impermeable layers 14, 16, of differing composition, generally confers greater flexibility and lighter weight to the assembly.

The overall thickness of each spacer layer 18, 20 can be determined on the basis of the teachings above. In an example, each spacer layer 18, 20 may have a thickness in the region of 0.5-1.0 mm for a characteristic impedance of 90 ohms.

In order to maximise the flexibility of the structure, the spacer layers 18, 20 are preferably not bonded to the layers 14, 16 of impermeable material but able to slide relative to those layers. They are, however, preferably bonded at their edges to the impermeable layers, in order to maintain the integrity of the assembly in use. In some embodiments, the spacer layers are bonded together, which can ensure that their thickness remains constant during use, even though at the expense of some flexibility, for example in cases where flexure of the device may be such as to alter the characteristic impedance of the device beyond permissible limits. It is, though, not excluded that in some embodiments the spacer layers may float in a pocket formed by the underlying impermeable layer and the overlying shield layer 22, 24.

In another embodiment, the spacer layers may be composed of non-conductive yarns disposed in both warp and weft directions of the fabric substrate, and so woven as to form spacer layers above and below the conductors of the fabric core, in techniques known in the art as double cloth and triple cloth. This embodiment provides for the spacer layers to be woven as integral with, and as part of the process of weaving, the fabric substrate. The attendant advantages of this embodiment are reducing component count and simplifying production.

Figure 15:
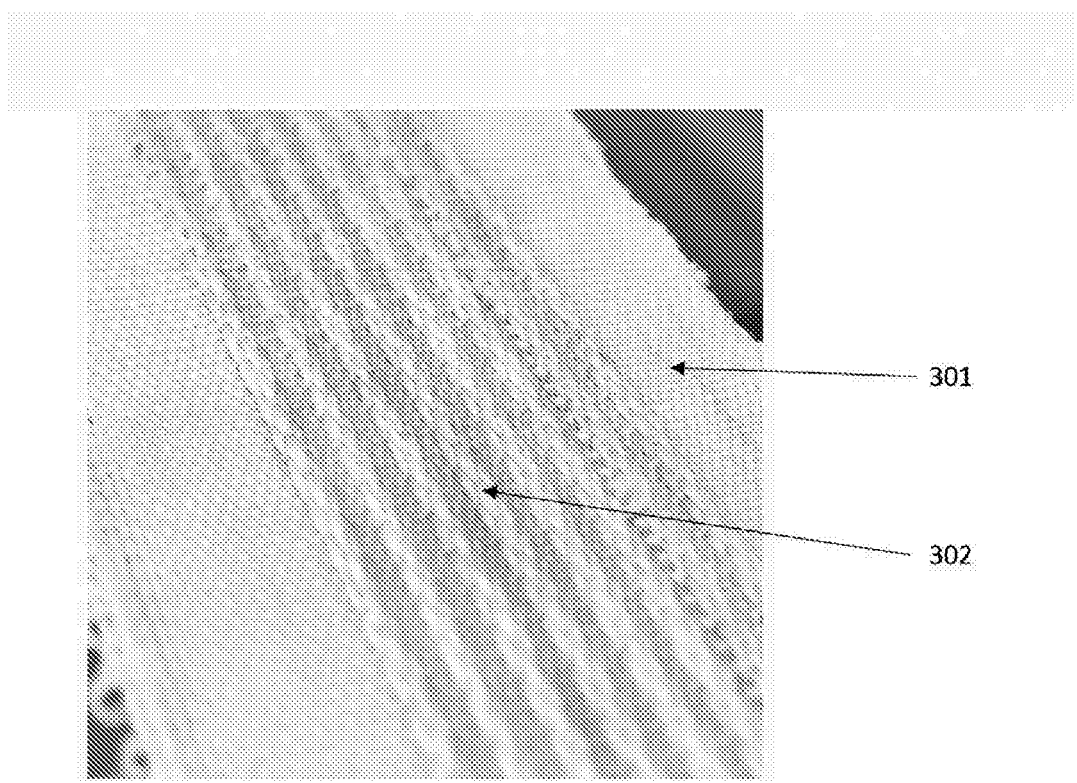
FIG. 15 is a photograph of an embodiment of the conductive fabric substrate in which the spacer layers are provided by non-conductive yarns woven into the substrate as a double cloth.

Referring to FIG. 15, this image shows an embodiment of a fabric core 301 that includes a woven spacer layer 302 in its construction. It can be seen that the spacer layer comprises raised stripes 302 of non-conductive yarns woven in both warp and weft directions, in a manner known to the art as double cloth. In this particular embodiment, it can also be seen that the raised double cloth stripes 302 are each disposed above and below a single conductor. In other embodiments, the raised double cloth stripes may be disposed above and below a plurality of conductors, which is described in greater detail below.

Figure 16:
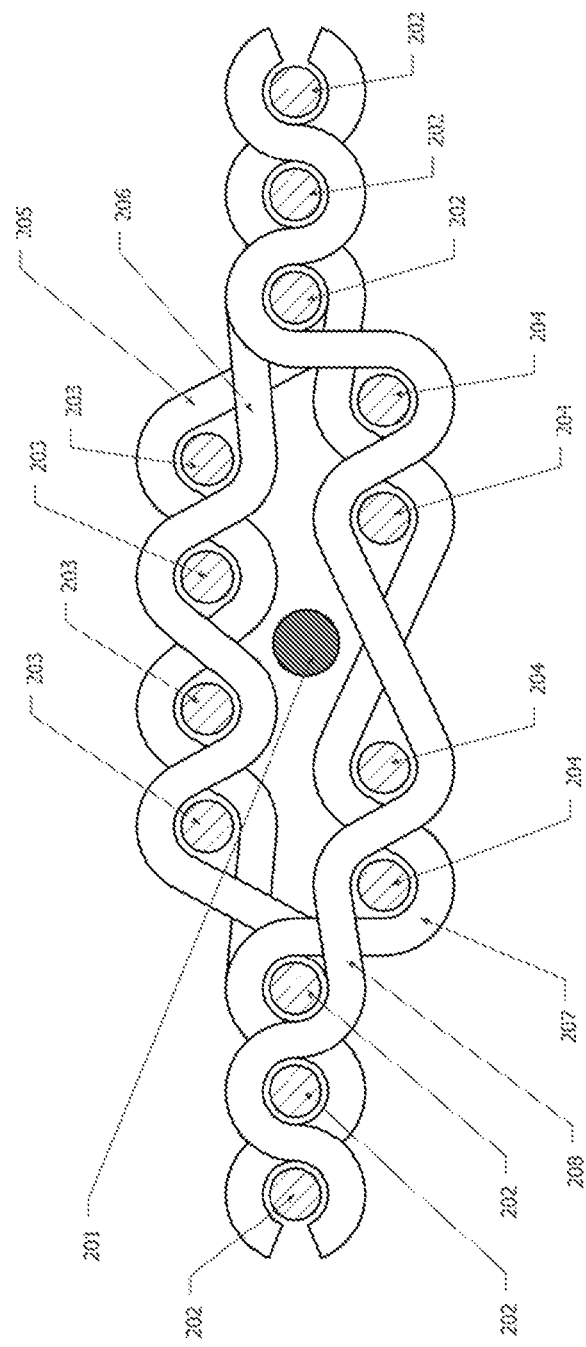
FIG. 16 is a cross-sectional schematic view of an embodiment of the conductive fabric substrate in which the spacer layers are provided by non-conductive yarns woven into the substrate as a double cloth.

Referring to FIG. 16, which is a cross-sectional schematic of the woven construction of the fabric core of this embodiment, a conductor 201, shown in cross-section, is disposed in the warp direction alongside non-conductive yarns 202 that constitute a further section of the warp yarns. A plurality of non-conductive warp yarns 203 in the vicinity of the conductor 201 are threaded to a different harness or shaft of the weaving loom to the yarns 202, such that they may be lifted apart from the remainder of the warp yarns 201, 202, 204 during weaving. When lifted apart in this manner and woven with consecutive pick insertions of the weft yarns 205 and 206, the yarns 203, 205, 206 form a distinct layer of woven material, as shown, and as known in the art as double cloth. This distinct non-conductive layer of woven material comprising yarns 203, 205, 206 constitutes a spacer layer above the conductor 201.

Similarly, a plurality of warp yarns 204 is threaded to a further different harness or shaft of the weaving loom, and is woven consecutively with weft yarns 207 and 208 to form a spacer layer below the conductor 201.

It is evident that the thickness of the spacer layers may be controlled by the diameters of the yarns 203, 205, 206 or 204, 207, 208. Advantageously, selecting the diameter of the warp yarns 203 and 204 controls the thickness of the spacer layers without adding undue thickness to the remainder of the fabric core woven by yarns 202, 205, 206, 207, 208.

In this particular embodiment, the conductor 201 is not directly interwoven with any weft yarns, and is instead effectively contained within a pocket or sleeve formed by the two layers of woven material of the double cloth. This may be advantageous in some cases, for example if the conductor 201 has a larger diameter, or less flexibility, relative to the non-conductive warp yarns 202, 203, 204.

In cases where it is sought instead to interweave directly the conductor 201 with the weft yarns, a similar woven construction known in the art as triple cloth may be employed. This may be desired in order to fix accurately the location of the conductor within the fabric core, for instance, or to provide for a single woven spacer layer that is disposed above or below a multiplicity of conductors.

Figure 17:
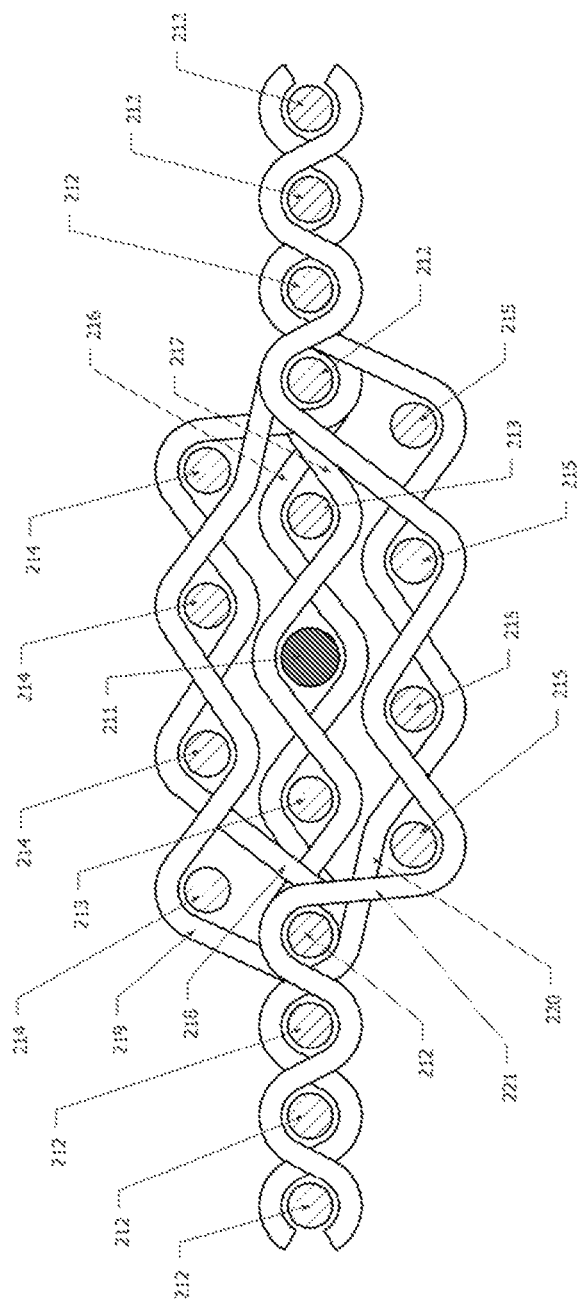
FIG. 17 is a cross-sectional schematic view of an embodiment of the conductive fabric substrate in which the spacer layers are provided by non-conductive yarns woven into the substrate as a triple cloth, and wherein the spacer layers are provided for a single conductor.

With reference to FIG. 17, this shows a cross-sectional schematic diagram of an embodiment of fabric core that includes woven spacer layers in a triple cloth construction, the warp-direction conductor 211 being again shown in cross-section. The upper spacer layer is composed of the non-conductive warp yarns 214 interwoven with the non-conductive weft yarns 218, 219. The lower spacer layer is composed of non-conductive warp yarns 215 interwoven with the non-conductive weft yarns 220, 221. The remainder of the fabric core is composed of all of the weft yarns interwoven with the non-conductive warp yarns 212.

As distinct from the embodiment shown in FIG. 16, this embodiment also provides non-conductive warp yarns 213, which are threaded to a yet further different harness or shaft to the warp yarns 212, 214, 215. This enables the weaving of a third distinct layer of woven material, disposed between the spacer layers, and comprising the warp yarns 213 and weft yarns 216, 217, and into which the conductor 211 may be interwoven as shown. The three distinct layers of woven material in this structure thus garners the term triple cloth in the art.

This triple cloth embodiment serves the purpose of retaining the conductor 211 in a substantially fixed location within the fabric core. Another advantage of this triple cloth structure is that multiple parallel conductors may be retained and provided with woven spacer layers above and below. This is shown in FIG. 18, with multiple conductors 231, 232, 233.

Figure 18:
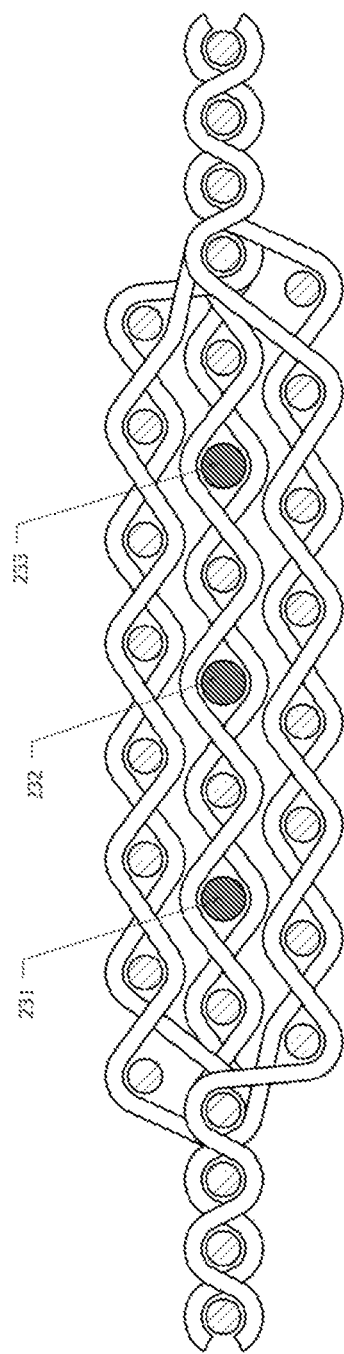
FIG. 18 is a cross-sectional schematic view of an embodiment of the conductive fabric substrate in which the spacer layers are provided by non-conductive yarns woven into the substrate as a triple cloth, and wherein the spacer layers are provided for a multiplicity of conductors.

With reference to the FIGS. 16, 17 and 18, the schematic diagrams each show one pick repeat of the weave structure. In FIG. 16, the repeat is four picks in length, whilst in FIGS. 17 and 18 the repeat is six picks in length. It will be evident to one skilled in the art that alternative weave structures exist to obtain double cloth or triple cloth that will achieve the same aims, and so the weave structures shown in these diagrams are intended to be illustrative rather than prescriptive. It will also be evident to one skilled in the art that analogous double cloth and triple cloth weave structures exist for achieving similar spacer layers for conductors that lie in a weft direction.

Figure 13:
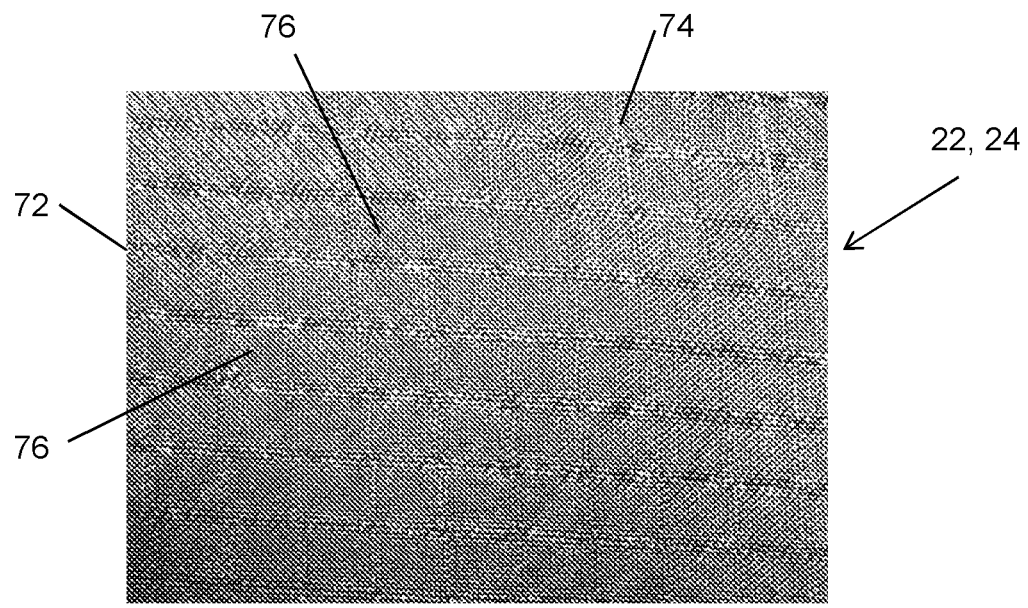
FIG. 13 is a photograph of a preferred embodiment of shield or screen layer of the assembly of FIG. 9.
Figure 14:
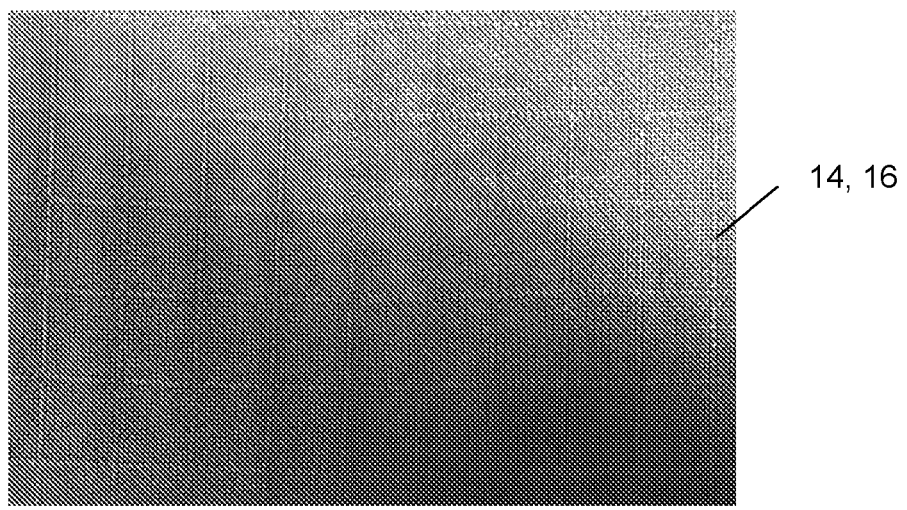
FIG. 14 is a photograph of a preferred embodiment of impermeable layer of the assembly of FIG. 9.

The shield layers 22, 24 can be seen in better detail in FIG. 13. These are, in this embodiment, also formed of a woven structure, as will be apparent in particular from FIG. 13, and preferably formed of crossing arrays 72, 74 of conductive fibres which create a conductive mesh. The woven fibres 76 between the mesh 72, 74 may be made of conductive or non-conductive filaments, or of non-conductive fabric that is coated and/or electroplated with a conductive material such as silver. As disclosed above, suitable fabrics can be obtained from Statex GmbH. The fibres 72, 74 may be made of the same materials as the conductive elements 40 of the fabric core 12.

The shield layers 22, 24 may have lateral dimensions that exceed those of the spacer layers 18, 20, particularly on their lateral sides, so as to extend beyond the sides of the shield layers 18, 20, with the impermeable layers 14, 16 having similar dimensions, such that the shield layers 22, 24 can be fixed to the impermeable layers 14, 16, by bonding, stitching, adhesive or in any other suitable manner.

The conductive shield layers 22, 24 may be coupled together electrically, which may be by being in direct contact or through a conductive bonding agent, by stitching with a conductive thread or the like. For this purpose, the impermeable layers 14, 16 may not extend as far as the conductive shield layers 22, 24 so as not to cause a separation between the shield layers 22, 24.

The shield layers 22, 24 shield the conductive fabric core 12 from electromagnetic interference. The conductive shield layers 22, 24 can also be used as ground planes or voltage reference points for voltage stabilisation. They may or may not be connected to a suitable ground reference.

In other embodiments, the shielding layers are bonded together at their edges by means of a non-conductive bonding agent. The thickness of the bonding agent between the edges of the shielding layers is preferably less than a quarter of the width of the bonded edges of the layers. In other words, the width of the bonded edges is at least four times the gap thickness provided by the bonding agent. This is advantageous in order to minimise the passage of electromagnetic radiation in to or out from the shielded volume, through the gap.

Whilst the preferred embodiments include impermeable membranes 14, 16 either side of the conductive fabric core 12, the skilled person will appreciate that these are not always essential and could be omitted. Where the apparatus may be subjected to water or humidity, any water or vapour insulation could be provided by an element other than the layers 14, 16, for example as an outer layer of an item of apparel.

In some embodiments the structure may be one-sided, that is to have only one optional impermeable layer 14, one spacer layer 18 and one conductive shield layer 22. This arrangement can be used, for instance, in assemblies in which the conductive fabric layer 12 is placed on a substrate, such as a backing sheet or the like, or in assemblies where shielding is not required but a ground plane is for signal transmission. In such an example, there may or may not be provided an underlying impermeable layer 16 between the conductive fabric core 12 and the substrate upon which it is placed.

The structure disclosed herein can be used in a variety of different applications including for wearable apparel such as jackets, coats, vests, trousers, capes, as well as helmets, gloves and the like. The applications are not limited to wearable items, but also generally to all of those items where woven textile compositions are advantageous, and the addition of electrically conductive function therein might also be advantageous, such as in furnishings, carpeting, tenting, vehicle upholstery, luggage, hard composite structures, medical dressings, structural textiles and so on. The structures disclosed herein may also offer advantages over more conventionally constructed electrical circuits, such as printed circuit boards, flexible circuit boards, cables, cable harnesses and wiring looms, due to the fabrics' flexibility, robustness, low-profile, light weight and automated means of manufacture.

Figure 19:
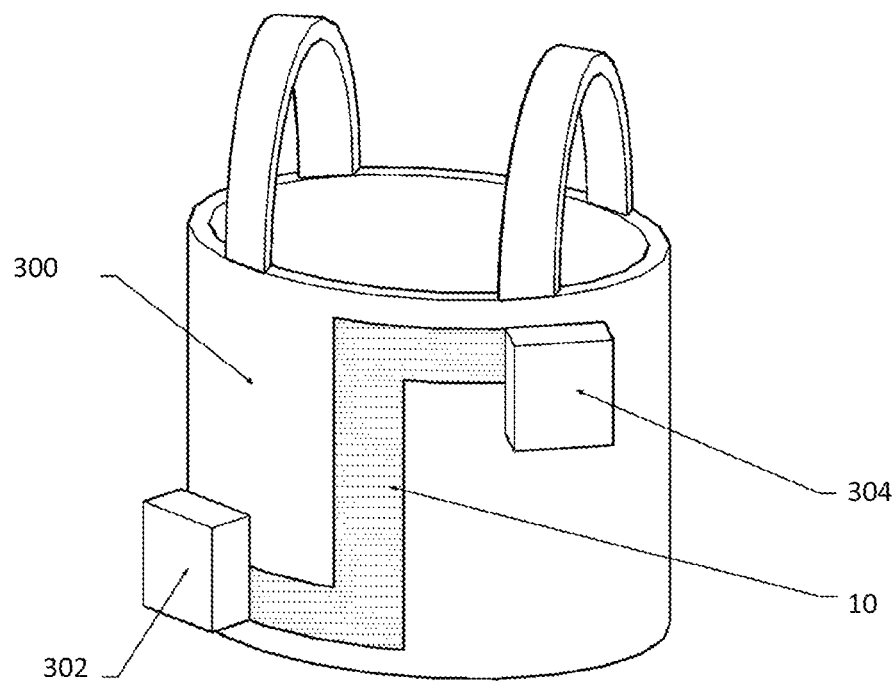
FIG. 19 is schematic diagram of an item of apparel incorporating an embodiment of the invention.
Figure 20:
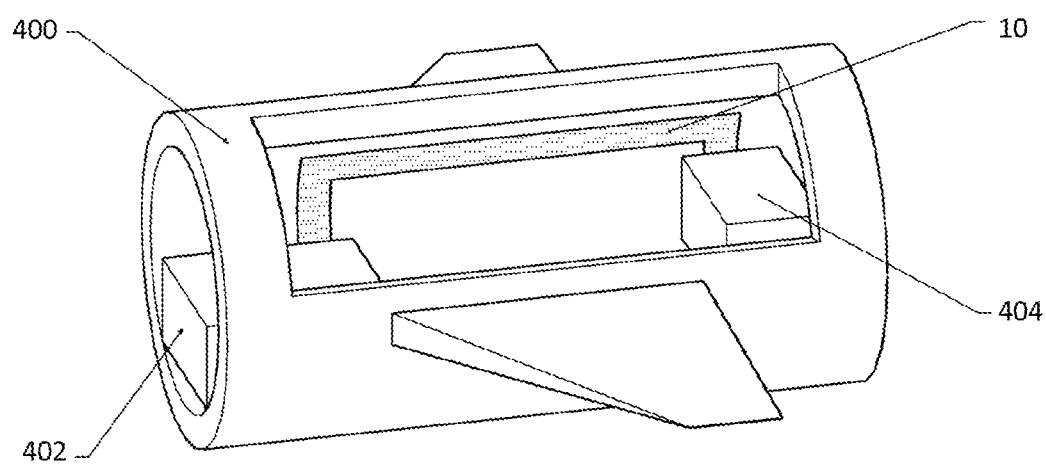
FIG. 20 is a schematic diagram of a section of an aeroplane fuselage incorporating an embodiment of the invention.
Figure 21:
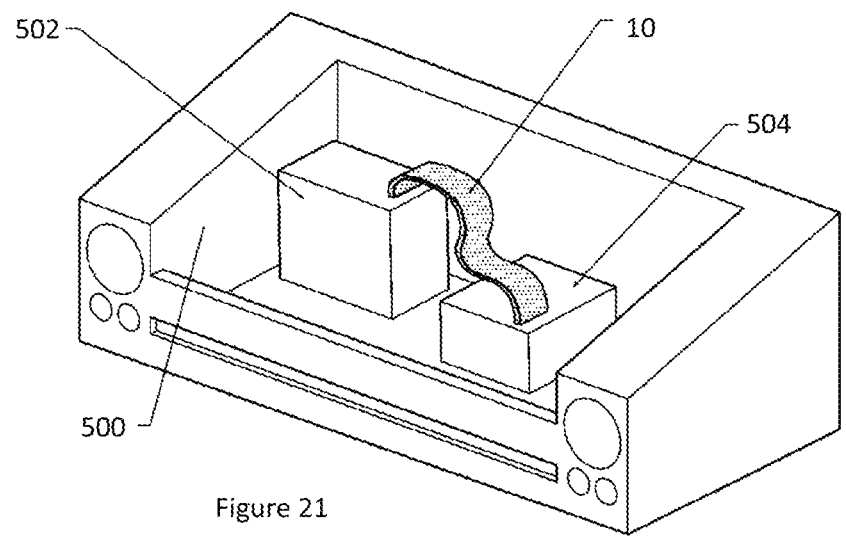
FIG. 21 is a schematic diagram of a vehicle engine bay incorporating an embodiment of the invention.
Figure 22:
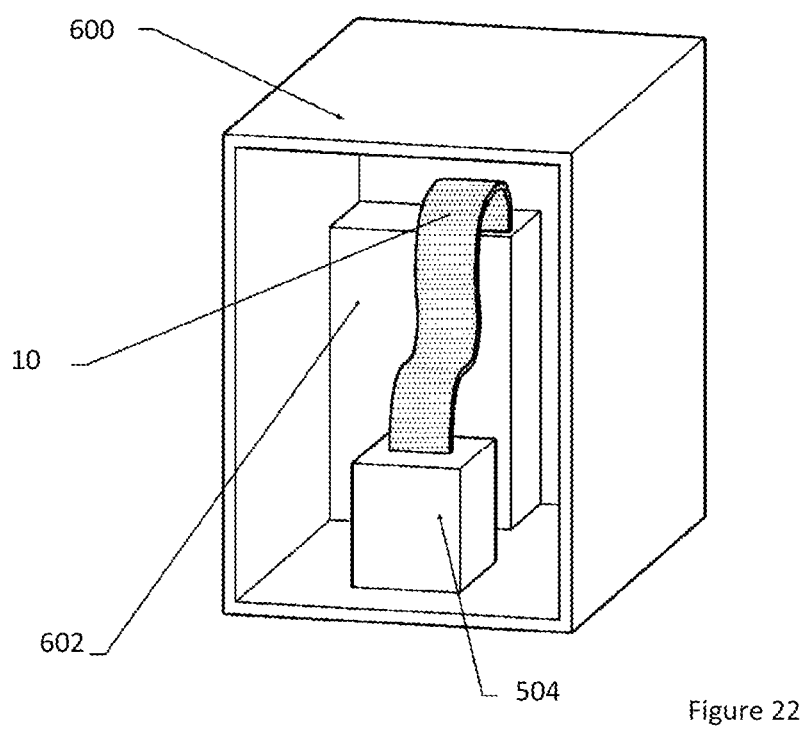
FIG. 22 is a schematic diagram of an equipment cabinet incorporating an embodiment of the invention.

FIG. 19 is a schematic diagram of an item of apparel 300, in this embodiment a vest, to which is fitted an embodiment of the conductive textile assembly taught herein, connecting first and second electrical components 302, 304 on the item of apparel. FIG. 20 shows a schematic diagram of a part of an aircraft fuselage 400 in which there is provided a conductive textile assembly 10 coupling electrically together first and second electrical components 402, 404. FIG. 21 is a schematic diagram of a vehicle engine bay 500 in which first and second electrical components 502, 504 are connected together by an embodiment of conductive textile assembly 10 as taught herein. FIG. 22 is a schematic diagram of an equipment cabinet 600 in which first and second electrical components 602, 604 are coupled together by an embodiment of conductive textile assembly 10 as disclosed herein.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosure in the abstract accompanying this application is incorporated herein by reference.

The invention claimed is:

1. A conductive textile assembly including:
a textile substrate having a plurality of electrical conductors therein, the substrate including first and second opposing sides;
a first flexible conductive shield or screen layer disposed over the first side of the textile substrate;
a second flexible conductive shield or screen layer disposed over the second side of the textile substrate; and
first and second non-conductive flexible spacer layers each disposed between a respective shield or screen layer and the textile substrate, the first and second non-conductive flexible spacer layers defining distinct layers of the assembly;
wherein the first and second flexible conductive shield or screen layers are electrically insulated from the textile substrate, and
wherein the first and second spacer layers provide a substantially uniform dielectric gap between the conductors of the textile substrate and the first and second shield or screen layers over at least an operative section of the assembly.

2. A conductive textile assembly according to claim 1, wherein each spacer is formed of a layer of non-conductive material or a thickness of non-conductive fibres disposed over the electrical conductors of the textile substrate and forming a part of the weave of the substrate.

3. A conductive textile assembly according to claim 1, wherein the or each spacer retains a substantially consistent spacing between its respective shield or screen layer and the textile substrate, thereby to provide a substantially uniform dielectric gap between the conductors of the textile substrate and the shield or screen layers over at least an operative section of the assembly.

4. A conductive textile assembly according to claim 1, wherein the substrate, the shield or screen layers and the spacers are bonded to one another.

5. A conductive textile assembly according to claim 1, wherein
the textile substrate is a woven fabric and the plurality of electrical conductors are a part of the weave, and
the electrical conductors are disposed generally side by side in co-planar relationship with a substantially uniform spacing to the shield or screen layer.

6. A conductive textile assembly according to claim 1, wherein the or each spacer is:
(i) a layer of non-conductive material, or
(ii) a thickness of non conductive fibres disposed over the electrical conductors of the textile substrate and forming a part of the weave of the substrate.

7. A conductive textile assembly according to claim 1, wherein the non-conductive spacer is laterally compressible and substantially incompressible into the plane thereof.

8. A conductive textile assembly according to claim 1, wherein the non-conductive spacer is formed of a layer of one of textile, foam or sheet material.

9. A conductive textile assembly according to claim 1, wherein each non-conductive spacer is formed of an open mesh of non conductive filaments.

10. A conductive textile assembly according to claim 9, wherein the non conductive filaments are arranged in a honeycomb array of tessellating polygons.

11. A conductive textile assembly according to claim 9, wherein the non conductive spacer layer is formed from two or more layers of open mesh of non-conductive filaments.

12. A conductive textile assembly according to claim 1, wherein each spacer layer is composed of non-conductive yarns disposed in both warp and weft directions of the fabric substrate and woven to form non-conductive textile layers on the first and second sides of the conductive layer.

13. A conductive textile assembly according to claim 1, wherein each non-conductive spacer has a thickness of 0.5 to 1.0 millimetres.

14. A conductive textile assembly according to claim 1, including two layers of impermeable material, each covering a respective side of the fabric, each layer of impermeable material being disposed directly adjacent the fabric substrate so as to overlie the or a respective spacer.

15. A conductive textile assembly according to claim 1, wherein each flexible conductive shield or screen is formed of a woven fabric material.

16. The conductive textile assembly of claim 1 defined within a wearable item of apparel, the wearable item of apparel further including a flat, ribbon-like cable.

17. The conductive textile assembly of claim 1 provided within a vehicle fuselage, engine bay or equipment cabinet.

* * * * *